(12) United States Patent
Tokunaga

(10) Patent No.: US 10,586,899 B2
(45) Date of Patent: Mar. 10, 2020

(54) LIGHT-EMITTING DEVICE

(71) Applicant: NICHIA CORPORATION, Anan-shi, Tokushima (JP)

(72) Inventor: Eiji Tokunaga, Komatsushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/201,970

(22) Filed: Nov. 27, 2018

(65) Prior Publication Data

US 2019/0165224 A1    May 30, 2019

(30) Foreign Application Priority Data

Nov. 28, 2017 (JP) ................................. 2017-227453

(51) Int. Cl.
| | |
|---|---|
| *H01L 33/58* | (2010.01) |
| *H01L 27/02* | (2006.01) |
| *H01L 33/50* | (2010.01) |
| *H01L 33/62* | (2010.01) |
| *H01L 25/16* | (2006.01) |
| *H01L 33/60* | (2010.01) |

(52) U.S. Cl.
CPC .......... *H01L 33/58* (2013.01); *H01L 27/0248* (2013.01); *H01L 33/505* (2013.01); *H01L 33/62* (2013.01); *H01L 25/167* (2013.01); *H01L 33/60* (2013.01); *H01L 2933/005* (2013.01); *H01L 2933/0041* (2013.01); *H01L 2933/0058* (2013.01)

(58) Field of Classification Search
CPC ....... H01L 33/58; H01L 33/505; H01L 33/62; H01L 27/0248

USPC ........................................................... 257/98
See application file for complete search history.

(56) References Cited

U.S. PATENT DOCUMENTS

| | | | | |
|---|---|---|---|---|
| 2004/0257797 A1* | 12/2004 | Suehiro | ................ | H01L 33/507 362/34 |
| 2005/0211991 A1* | 9/2005 | Mori | ..................... | H01L 33/501 257/79 |

(Continued)

FOREIGN PATENT DOCUMENTS

| | | |
|---|---|---|
| JP | 2012-134355 A | 7/2012 |
| JP | 2013-026558 A | 2/2013 |

(Continued)

*Primary Examiner* — Igwe U Anya
(74) *Attorney, Agent, or Firm* — Foley & Lardner LLP

(57) ABSTRACT

A light-emitting device includes: a light-emitting element having a polygonal shape; a wavelength conversion plate; a bonding member; and a first covering member. The bonding member has an inclined surface continuous from a region between a conversion-plate first surface and an element second surface and inclined from a peripheral region of the conversion-plate first surface toward an element first surface at lateral surfaces of the light-emitting element. The inclined surface at a first cross section along a first cross-sectional line, which connects a center of the light-emitting element in a plan view to a vertex of the polygonal shape, is closer to a lateral surface of the light-emitting element than the inclined surface at a second cross section along a second cross-sectional line, which connects the midpoint of a side connecting the vertex and its adjacent vertex of the polygonal shape to the center of the light-emitting element.

11 Claims, 12 Drawing Sheets

(56) References Cited

U.S. PATENT DOCUMENTS

| | | | |
|---|---|---|---|
| 2014/0246648 A1* | 9/2014 | Im | H01L 33/382 |
| | | | 257/13 |
| 2016/0093777 A1 | 3/2016 | Sato et al. | |
| 2016/0293810 A1 | 10/2016 | Baike et al. | |
| 2016/0351765 A1 | 12/2016 | Suzuki | |
| 2016/0351768 A1 | 12/2016 | Matsuda et al. | |
| 2017/0033267 A1 | 2/2017 | Tamaki et al. | |
| 2017/0062671 A1 | 3/2017 | Hashimoto et al. | |
| 2017/0092825 A1 | 3/2017 | Bando | |
| 2017/0125649 A1 | 5/2017 | Sato et al. | |
| 2017/0154880 A1 | 6/2017 | Ozeki et al. | |
| 2017/0179341 A1* | 6/2017 | Chao | H01L 33/22 |
| 2018/0198038 A1 | 7/2018 | Sato et al. | |
| 2018/0315912 A1* | 11/2018 | Yun | H01L 24/17 |
| 2019/0385993 A1 | 12/2019 | Ozeki et al. | |

FOREIGN PATENT DOCUMENTS

| | | |
|---|---|---|
| JP | 2016-072515 A | 5/2016 |
| JP | 2016-122868 A | 7/2016 |
| JP | 2016-197715 A | 11/2016 |
| JP | 2016-219743 A | 12/2016 |
| JP | 2016-225598 A | 12/2016 |
| JP | 2017-028010 A | 2/2017 |
| JP | 2017-033967 A | 2/2017 |
| JP | 2017-050321 A | 3/2017 |
| JP | 2017-055088 A | 3/2017 |
| JP | 2017-069368 A | 4/2017 |
| JP | 2017-092483 A | 5/2017 |
| JP | 2017-108092 A | 6/2017 |

\* cited by examiner

BACKGROUND ART

LIGHT-EMITTING DEVICE

CROSS-REFERENCE TO RELATED APPLICATION

The present application claims priority under 35 U. S. C. § 119 to Japanese Patent Application No. 2017-227,453, filed on Nov. 28, 2017, the content of which are hereby incorporated by reference in their entirety.

BACKGROUND

The present disclosure relates to a light-emitting device.

Light-emitting devices including light-emitting elements, such as light-emitting diodes, are used for backlight devices for liquid crystal display devices, illumination devices, etc. In one example of such a light-emitting device, as shown in a schematic cross-sectional view in FIG. 10, a light-emitting element having a substantially rectangular shape in a plan view is mounted on a sub-mount substrate, a plate-shaped transparent member is located on a light-emitting surface of the light emitting element, and a reflective material layer surrounds the light-emitting element and the transparent member. In the light-emitting element illustrated in FIG. 10, a plate-shaped optical member 114 having an outer periphery surrounded by a white-ceramic outer frame 124 is mounted on a light-emitting element 111, which is mounted on a mounting substrate, via an optical layer 113. An outer periphery of the optical layer 113 and an outer periphery of the white-ceramic outer frame 124 of the plate-shaped optical member 114 are covered with a light-reflective resin material 115. See, e. g., Japanese Patent Publication No. 2012-134,355.

A light-emitting element having a rectangular shape in a plan view does not exhibit a light emission pattern having a circular shape in a plan view of the light emitting element, which may cause unevenness in light distribution in accordance with an angle at which the light-emitting device is mounted.

It is an object of certain embodiments of the present disclosure to provide a light-emitting device with a light emission pattern close to a circular shape in a plan view.

SUMMARY

According to one embodiment of the present invention, a light-emitting device includes: a support member; a light-emitting element, having a polygonal shape with five or more sides in a plan view, mounted on the support member, and including a first element surface and a second element surface opposite to the first element surface and being a light-emitting surface; a wavelength conversion plate including a first conversion-plate surface and a second conversion-plate surface opposite to the first conversion-plate surface and having a smaller area than that of the first element surface; a bonding member bonding the first conversion-plate surface and the second element surface together; and a first covering member that is light-reflective and covers the bonding member and the wavelength conversion plate. The bonding member is disposed continuously from a bonding region formed between the first conversion-plate surface and the second element surface toward lateral surfaces of the light-emitting element, and has an inclined surface that is inclined from a peripheral region of the first conversion-plate surface toward the first element surface at lateral surfaces of the light-emitting element. A portion of the inclined surface of the bonding member at a first cross section along a first cross-sectional line is located closer to a lateral surface of the light-emitting element than a portion of the inclined surface of the bonding member at a second cross section along a second cross-sectional line. The first cross-sectional line connects the center of the light-emitting element having the polygonal shape in a plan view to one vertex of vertices of the polygonal shape. The second cross-sectional line connecting a midpoint of a side connecting said one vertex and adjacent one of the vertices to the center of the light-emitting element having the polygonal shape in a plan view.

By employing the configuration as described above, brightness in the vicinity of the corners of the light-emitting element may be reduced whereas brightness in the vicinity of portions in the middle of adjacent corners of the light-emitting element may be increased to obtain a light emission pattern in a plan view close to a circular shape rather than the polygonal shape. This allows for reducing unevenness in light distribution in accordance with an angle of the light-emitting device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1:
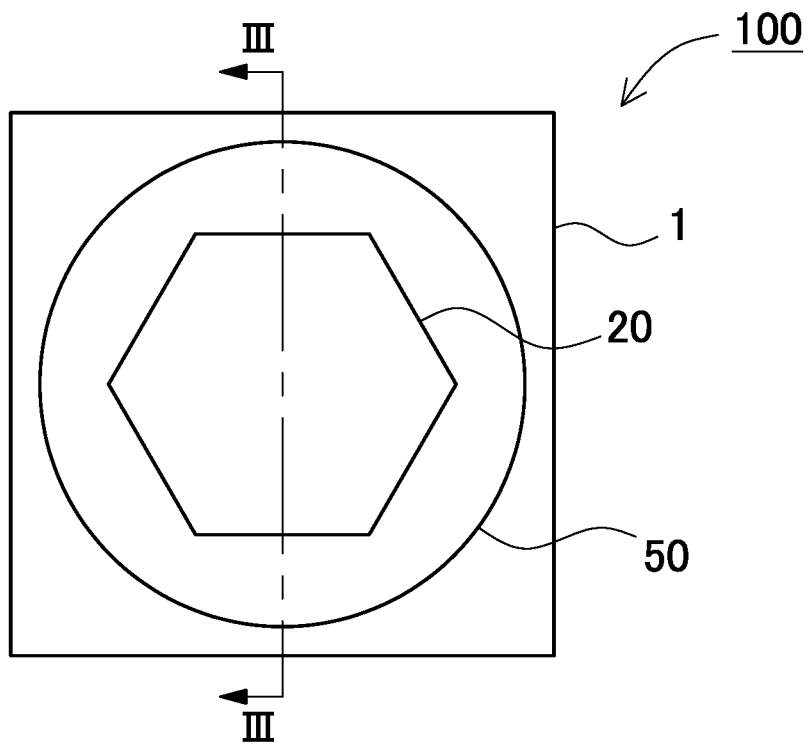
FIG. 1 is a schematic plan view of a light-emitting device according to a first embodiment of the present invention.
Figure 2:
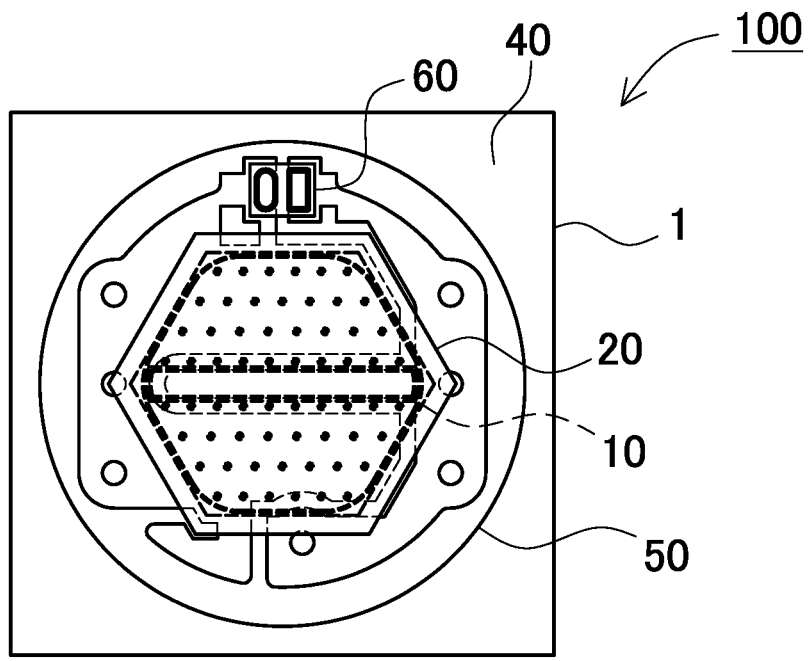
FIG. 2 is a schematic perspective plan view of the light-emitting device in FIG. 1.

Certain embodiments and examples of the present invention will be described below with reference to the accompanying drawings. The embodiments described below are examples intended to give a concrete form to the technical concepts of the present invention, but the present invention is not limited to the embodiments and examples below. It should be noted that sizes or positional relationships of members illustrated in each drawing may be exaggerated in order to clarify the descriptions. Furthermore, in the descriptions below, the same name or the same reference numeral represents the same member or members made of the same material, and its duplicative description will be omitted as appropriate. As for each element that constitutes the embodiments and examples of the present invention, a plurality of elements may be formed of one member so that the member serves as the plurality of elements, or conversely, a combination of a plurality of members may fulfill the function of one member. Constitutions described in one example or embodiment may be applied to another example or embodiment. The descriptions below include terms indicating directions or positions (for example, "up", "down", "right", "left", and other terms inclusive of these terms) as appropriate.

First Embodiment

A light-emitting device 100 according to a first embodiment of the present invention is illustrated in FIGS. 1 to 3, 7, 8A and 8B. The light-emitting device 100 illustrated in these drawings includes: a support member 1; a light-emitting element 10 mounted on the support member 1; a wavelength conversion plate 20 disposed on an upper surface of the light-emitting element 10; a bonding member 30 bonding the wavelength conversion plate 20 and the light-emitting element 10; a first covering member 40 covering the bonding member 30 and the wavelength conversion plate 20; and a sealing member 50 disposed on an upper surface of the wavelength conversion plate 20. The light-emitting element 10 has a first element surface 11 and a second element surface 12, which is opposite to the first element surface 11 and is a light-emitting surface. The light-emitting element 10 has a polygonal shape with five or more corners in a plan view. The wavelength conversion plate 20 has a first conversion-plate surface 21 and a second conversion-plate surface 22 opposite to the first conversion-plate surface 21. The first conversion-plate surface 21 has an area larger than an area of the second element surface 12. The bonding member 30 bonds the first conversion-plate surface 21 and the second element surface 12. The first covering member 40 has light reflectivity.

The bonding member 30 is disposed continuously from the bonding region formed between the first conversion-plate surface 21 and the second element surface 12, and has an inclined surface 31 that is inclined from a peripheral region 21b of the first conversion-plate surface 21 toward the first element surface 11 around the lateral surfaces 13 of the light-emitting element 10. When a line that connects the center of the light-emitting element 10 of the polygonal shape in a plan view and one vertex of the polygonal shape is referred to as a first cross-sectional line, and a line that connects the midpoint of a side between the one vertex and another adjacent vertex to the center of the light-emitting element 10 of the polygonal shape in a plan view is referred to as a second cross-sectional line, the inclined surface of the bonding member 30 in the cross sectional view taken along the first cross-sectional line is closer to a lateral surface of the light-emitting element than the inclined surface of the bonding member in the cross-sectional view taken along the second cross-sectional line.

Support Member 1

The light-emitting element 10, the sealing member 50, and other components are mounted on the support member 1. The support member 1 includes an insulating base member, and a conductive member 2 on a surface of the base member, such as a wiring pattern, for mounting the light-emitting element 10 thereon. For the insulating base member of the support member 1, ceramics and resins (examples thereof including fiber reinforced resin) may be used. Examples of the ceramic substrate include alumina and aluminum nitride. Examples of the resins include thermosetting resins such as epoxy resins, silicone resins, BT resins, polyimide resins, and unsaturated polyester resins, thermoplastic resins such as polyphthalamide resin and nylon resins, modified resins of these resins, and hybrid resins containing at least one of these resins. The base member may have a single-layer structure or a multilayer structure. In the example illustrated in FIG. 3, etc., aluminum nitride is layered. Generally, because aluminum nitride has higher heat dissipation performance than that of resins, using aluminum nitride for the base material allows for improving heat dissipation performance of the light-emitting device. The base member may contain, for example, a colorant, a filler, or reinforcing fiber known in the field of the present invention. In particular, for the colorant, a material having high light reflectance is used, and a white material such as titanium oxide or zinc oxide is preferably used. Examples of the filler include silica and alumina. Examples of the reinforcing fiber include glass, calcium silicate, and potassium titanate.

As necessary, the conductive member 2 is disposed on an upper surface or a lower surface of the support member 1. The conductive member 2 is a wiring pattern, and the light-emitting element 10 is mounted on the wiring pattern. In the example illustrated in FIG. 3, a pair of conductive members 2 are disposed on the rear surface of the support member 1. Electrodes 18 are disposed on the light-emitting element 10, and are connected to the conductive members 2 of the support member 1 via connecting members 19 such as bumps in a flip-chip manner or the like.

Light-Emitting Element 10

The light-emitting element 10 has the first element surface 11 (i.e., the lower surface in FIG. 3), which is a mounting surface on which the electrodes 18 are disposed, and the second element surface 12 (i.e., the upper surface in FIG. 3), which is opposite to the first element surface 11 and serves as the light-emitting surface. The light-emitting element 10 has a polygonal shape with five or more corners in a plan view. In the example illustrated in a schematic plan view in FIG. 1, the light-emitting element 10 has a hexagonal shape in a plan view.

For the light-emitting element 10, for example, a semiconductor light-emitting element such as a light-emitting diode can be used. A peak emission wavelength of light emitted from the light-emitting element may be selected from an ultraviolet range to an infrared range. The semiconductor light-emitting element may include a light-transmissive growth substrate 16 and a semiconductor layered body 14 formed on the growth substrate 16. The semiconductor layered body 14 has an electrode formation surface, on which the electrodes 18 are disposed, at a side opposite to (i.e., away from) a side of the light-transmissive growth substrate 16. The light-transmissive growth substrate 16 serves as a light-extracting surface.

Semiconductor Layered Body 14

The semiconductor layered body 14 includes a plurality of semiconductor layers. For example, the semiconductor layered body 14 can include three semiconductor layers, i.e., a first conductive semiconductor layer (such as an n-type semiconductor layer), a light-emitting layer (i.e., active layer), and a second conductive semiconductor layer (such as a p-type semiconductor layer). A semiconductor layer configured to emit ultraviolet light or visible light in the blue to green range can be made of a semiconductor material such as Group III-V compound semiconductors or Group II-VI compound semiconductors. More specifically, a nitride-based semiconductor material represented by, for example, $In_XAl_YGa_{1-X-Y}N$ ($0 \leq X$, $0 \leq Y$, $X+Y \leq 1$), such as InN, AlN, GaN, InGaN, AlGaN, or InGaAlN, can be used. Examples of the semiconductor layered body 14 configured to emit red light include GaAs, GaAlAs, GaP, InGaAs, and InGaAsP.

Light-Transmissive Growth Substrate 16

In the case of using the nitride semiconductor material as described above, for the light-transmissive growth substrate 16 of the light-emitting element 10, for example, a light-transmissive insulating material such as sapphire ($Al_2O_3$) or a semiconductor material (such as a nitride-based semiconductor material) that transmits light emitted from the semiconductor layered body 14 can be used. As used herein, "light-transmissive" refers to having transmissivity of approximately 60%, 65%, 70%, or 80% or more with respect to light emitted from the light-emitting element 10.

Electrodes 18

The electrodes 18 of the light-emitting element 10 are disposed on the same surface side of the semiconductor layer. The electrodes 18 may have a single-layer structure or a multilayered structure such that each of the electrodes 18 is in ohmic connection to a respective one of the first conductive semiconductor layer and the second conductive semiconductor layer described above so as to obtain linear or substantially linear current-voltage characteristics. For the electrodes 18, a material and a structure that are known in the field of the present invention may be employed with any appropriate thickness. For example, the electrodes 18 preferably have a thickness in a range of 10 μm to 300 μm. A good electrical conductor may be used for the electrodes 18, and a metal such as Cu, Au, Ag, and AuSn is preferable.

Wavelength Conversion Plate 20

The wavelength conversion plate 20 is disposed on the upper surface of the light-emitting element 10 and converts a wavelength of light emitted from the second element surface 12 of the light-emitting element 10 into a different wavelength. For example, in the case in which the light-emitting element 10 is configured to emit blue light, the wavelength conversion plate 20 converts the wavelength of the blue light into a wavelength of yellow light, and the blue light and the yellow light are mixed to obtain white light. This wavelength conversion plate 20 has the first conversion-plate surface 21 (i.e., the lower surface in FIG. 3) and the second conversion-plate surface 22 (i.e., the upper surface in FIG. 3) opposite to the first conversion-plate surface 21. The first conversion-plate surface 21 has a larger area than an area of the second element surface 12. This enables the wavelength conversion plate 20 to entirely cover the second element surface 12, that is, the light-emitting surface of the light-emitting element 10. In other words, with a portion of the light-emitting surface of the light-emitting element 10 not covered with the wavelength conversion plate 20, light (for example, blue light) emitted from the light-emitting element 10 may be emitted outside without being mixed, so that unevenness in emission color can be reduced. In the example illustrated in a schematic perspective plan view in FIG. 2, the wavelength conversion plate 20 of a hexagonal shape having a size larger than a size of the hexagonal light-emitting element 10 is used.

For the wavelength conversion plate 20, a plate made of a resin containing a fluorescent material as a wavelength conversion material may be used. The fluorescent material may be uniformly dispersed in the resin or predominantly at one side of the resin. The fluorescent material is excited by the light emitted from the light-emitting element 10 and emits fluorescent light having a wavelength longer than a wavelength of light emitted from the light-emitting element 10.

Variant Example

Figure 4:
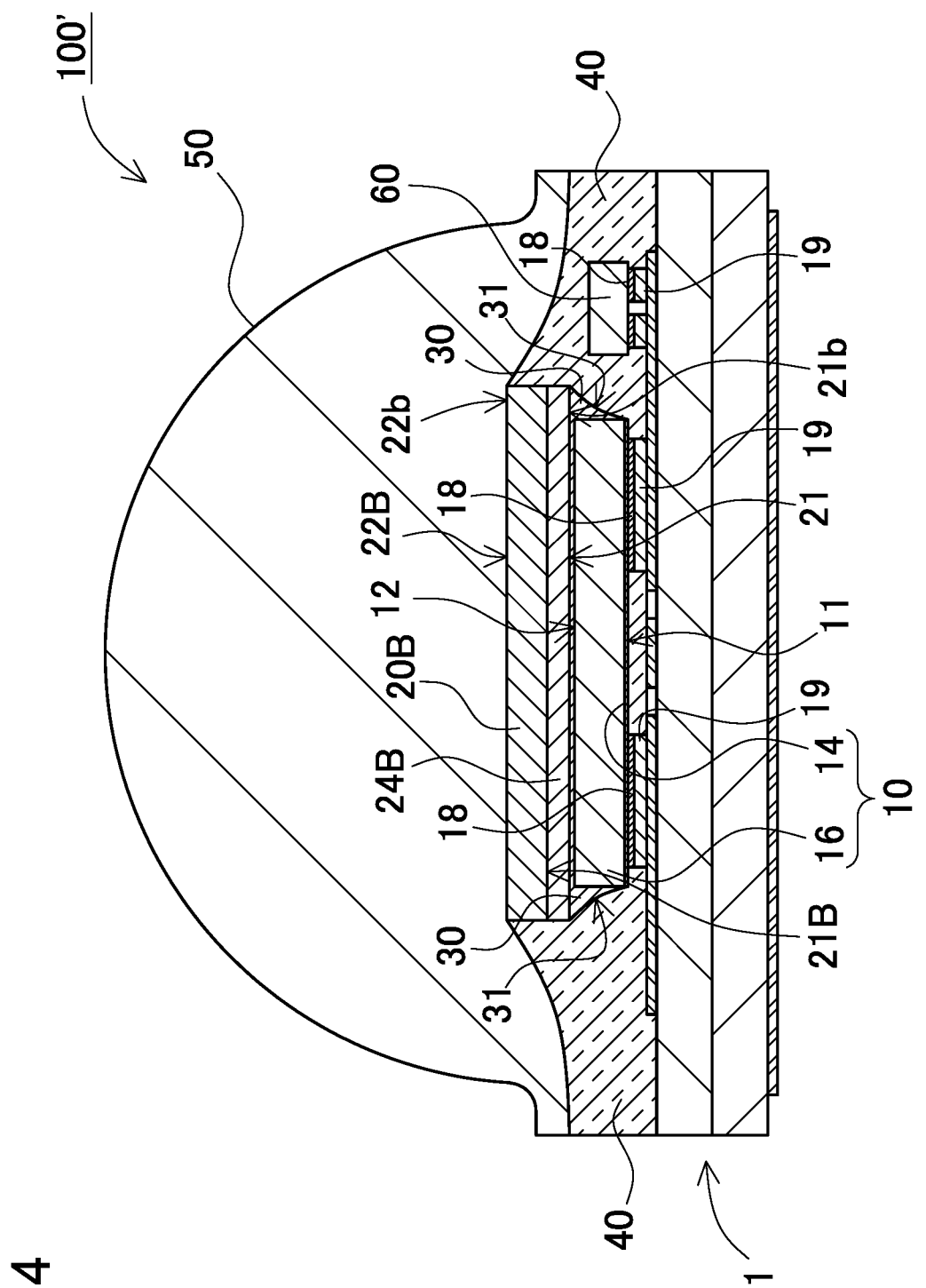
FIG. 4 is a schematic cross-sectional view of a light-emitting device according to a variant example.

The wavelength conversion plate may have any appropriate configuration. For example, a light-transmissive glass plate having a surface on which a wavelength conversion member such as a fluorescent material is disposed may be used. The wavelength conversion member such as a fluorescent material has a substantially uniform thickness on the glass plate. Such an example is illustrated in a schematic cross-sectional view in FIG. 4 as a variant example. A light-emitting element 100' shown in FIG. 4 includes a wavelength conversion plate 20B that has a first conversion-plate surface 21B and a second conversion-plate surface 22B. A fluorescent material 24B is printed on the first conversion-plate surface 21B, which is the lower surface of the glass plate. This configuration allows the fluorescent material 24B to have a substantially uniform thickness, so that the optical path length of light that transmits the fluorescent material 24B can be constant. Thus, unevenness in emission color can be reduced and occurrence of a yellow ring can be prevented. As an alternative to printing, the fluorescent material may be shaped into a sheet, and the fluorescent material sheet may be adhered to the glass plate. The glass may be selected from, for example, borosilicate glass and quartz glass.

In the wavelength conversion plate 20, a resin portion including the fluorescent material preferably has a thickness in a range of 20 μm to 500 μm. With the thickness of the wavelength conversion plate 20 larger than 500 μm, heat dissipation performance tends to be low. In view of heat dissipation performance, the thinner the wavelength conversion plate 20 is, the more preferable. It should be noted that, with the thickness of the wavelength conversion plate 20 less than 20 μm, the chromaticity range of light to be obtained tends to be narrow. In the case in which the wavelength conversion plate 20 includes glass, the thickness of the glass is preferably in a range of 20 μm to 500 μm. With a thickness of the glass of 20 μm or more, mechanical strength of the wavelength conversion plate 20 can be improved. With a thickness of the glass of 500 μm or less, a thickness of the light-emitting device can be reduced.

Figure 12:
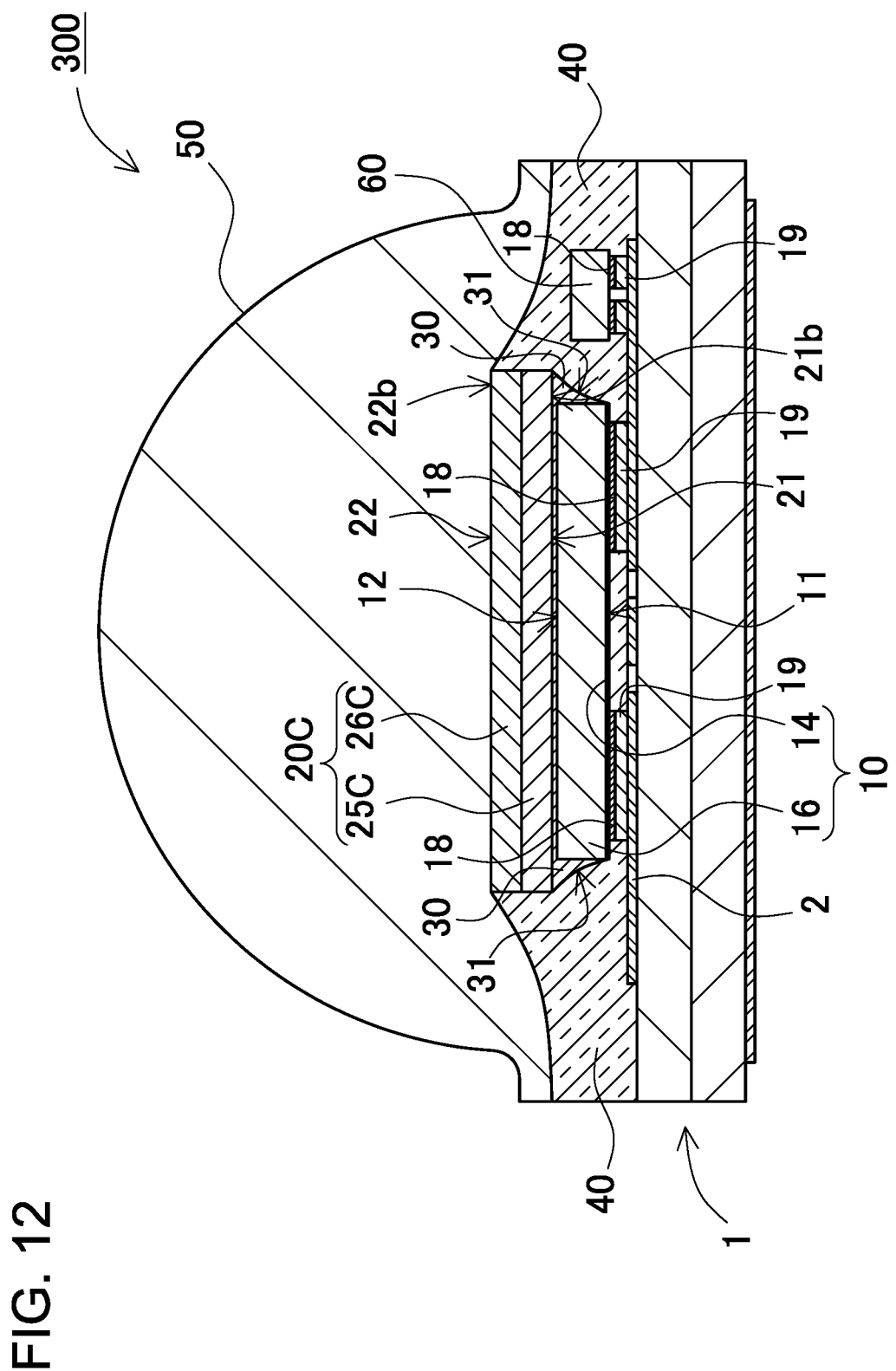
FIG. 12 is a schematic cross-sectional view of a light-emitting device according to another modification.

In the wavelength conversion plate 20, the resin portion including the fluorescent material may be a single layer or may have a multilayered structure. An example of a configuration where a wavelength conversion member is a plate made of a resin containing a fluorescent material and includes two wavelength conversion layers is shown in a schematic cross-sectional view in FIG. 12 as a variant example. In a light-emitting device 300 shown in FIG. 12, a wavelength conversion plate 20C includes a first wavelength conversion layer 25C and a second wavelength conversion layer 26C.

Figure 13:
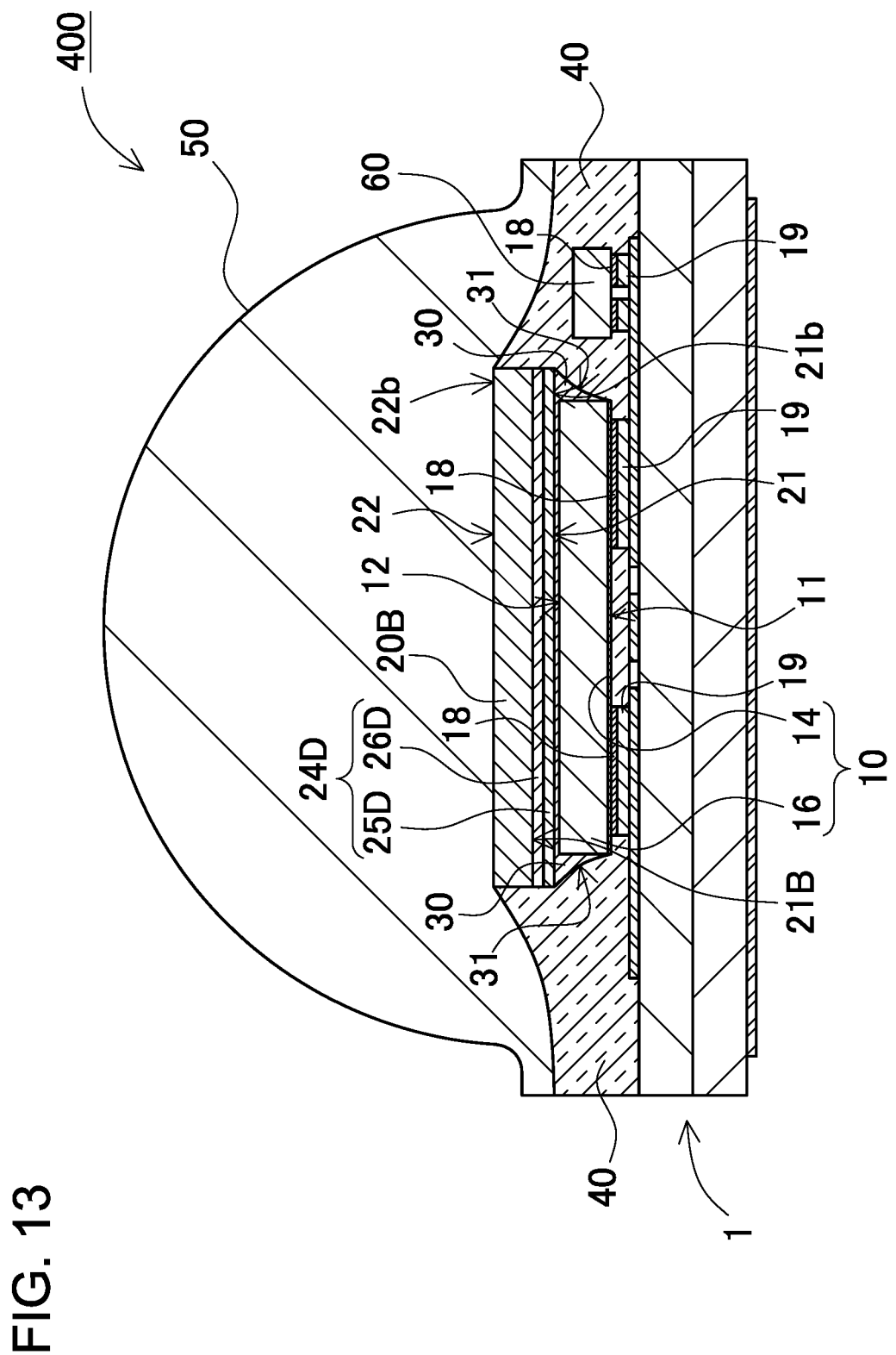
FIG. 13 is a schematic cross-sectional view of a light-emitting device according to even another modification.

Also, in a configuration where a fluorescent material is printed or coated on a surface of a glass plate or the like that constitutes a wavelength conversion plate, the fluorescent material may be in a plurality of layers. One example of such a configuration is illustrated in a schematic cross-sectional view in FIG. 13 as a variant example. In a light-emitting device 400 shown in FIG. 13, a fluorescent material 24D includes a first wavelength conversion layer 25D and a second wavelength conversion layer 26D. In the light-emitting devices 300 and 400 according to the variant examples, the components that are the same as corresponding components in the first embodiment or variant examples described above are denoted with same reference numerals and detailed description thereof may be omitted.

In the case in which a plurality of wavelength conversion layers of fluorescent materials or the like are formed, it is preferably that a first wavelength conversion layer containing a red fluorescent material is disposed on the second element surface 12 of the light-emitting element 10, and a second wavelength conversion layer containing a yellow fluorescent material is disposed on the first wavelength conversion layer. Because red light is not easily absorbed by the yellow fluorescent material, light-extracting efficiency of the light-emitting device can be improved. Examples of the red fluorescent material include CASN-based fluorescent material, SCASN-based fluorescent material and/or KSF-based fluorescent material. Examples of the yellow fluorescent material include YAG and/or LAG.

Fluorescent Material

For the fluorescent material, a fluorescent material excitable by light emitted from the light-emitting element 10 is used. Examples of fluorescent material excitable by light emitted from a blue-light emitting element or an ultraviolet-light emitting element includes: cerium-activated yttrium-aluminum-garnet-based fluorescent material (YAG:Ce); cerium-activated lutetium-aluminum-garnet-based fluorescent material (LAG:Ce); europium-activated and/or chromium-activated nitrogen-containing calcium aluminosilicate-based fluorescent material ($CaO$—$Al_2O_3$—$SiO_2$); europium-activated silicate-based fluorescent material (($Sr$, $Ba)_2SiO_4$); nitride-based fluorescent material such as δ SiAlON fluorescent material, CASN-based fluorescent material, and SCASN-based fluorescent material; KSF-based fluorescent material ($K_2SiF_6$:Mn); sulfide-based fluorescent material; and quantum dot fluorescent material. Such a fluorescent material is used in combination with a blue-light emitting element or an ultraviolet-light emitting element, which allows for manufacturing light-emitting devices that emit various colors (such as white-light emitting devices).

Bonding Member 30

The bonding member 30 bonds the first conversion-plate surface 21 and the second element surface 12 together. The bonding member 30 is applied between the first conversion-plate surface 21 and the second element surface 12 to bond the wavelength conversion plate 20 and the light-emitting element 10 together. A light-transmissive resin may be used for the bonding member 30. In order to bond the first conversion-plate surface 21 and the second element surface 12 together, the bonding member 30 may be made of a resin in a gel form in an uncured state, such as a thermoplastic resin or a thermosetting resin. For such a bonding member 30, for example, a dimethyl resin, a phenyl resin, and a diphenyl resin may be used. A wavelength conversion member adapted to convert a wavelength of light emitted from the light-emitting element may be mixed into the bonding member 30.

Inclined Surfaces 31

The bonding member 30 in an uncured state partly overflows from the bonding region formed between the first conversion-plate surface 21 and the second element surface 12 and reaches the lateral surfaces of the light-emitting element 10. That is, the bonding member 30 is disposed continuously from the bonding region formed between the first conversion-plate surface 21 and the second element surface 12 to the lateral surfaces of the light-emitting element 10, and extended from the peripheral region 21b of the first conversion-plate surface 21 toward the first element surface 11. Thus, as illustrated in the schematic cross-sectional view in FIG. 3, the inclined surface 31 is formed between the first conversion-plate surface 21 and the second element surface 12.

As used herein, the "peripheral region 21b" of the first conversion-plate surface 21 refers to a peripheral portion of the first conversion-plate surface 21 facing the second element surface 12. With the wavelength conversion plate 20 having a size larger than a size of the light-emitting element 10, the peripheral region 21b, which does not overlap the second element surface 12 in a plan view, is formed at a peripheral region of the first conversion-plate surface 21. Accordingly, during manufacturing of the light-emitting device, when the light-emitting element 10 and the wavelength conversion plate 20 are bonded with the uncured bonding member 30 in a gel form, the uncured bonding member 30, which has overflowed from the bonding region formed between the first conversion-plate surface 21 and the second element surface 12, is pressed out to the peripheral region 21b of the first conversion-plate surface 21, and flows down along the lateral surfaces of the light-emitting element 10. Thus, the inclined surface 31 is formed to be inclined from the first conversion-plate surface 21 toward the second element surface 12.

The inclined surface 31 is extended from the peripheral region 21b of the first conversion-plate surface 21 toward the first element surface 11. It should be noted that, the lower end of the inclined surface 31 may not necessarily be in the same plane with the first element surface 11. In accordance with the thickness of the light-emitting element and an applied amount of the bonding member, the lower end of the inclined surface 31 may be located on the lateral surfaces of the light-emitting element 10 between the first element surface 11 and the second element surface 12. In this case, the bonding member 30 is apart from the support member 1. With the bonding member 30 apart from the support member 1, absorption of light emitted from the light-emitting element by the support member through the bonding member can be reduced. The bonding member 30 preferably covers at least a portion of the semiconductor layers 14. With the semiconductor layers 14 including the light-emitting layer, the bonding member 30 covering a portion of the semiconductor layers 14 allows for facilitating extraction of light emitted from the light-emitting element toward outside of the light-emitting element through the bonding member 30. This configuration allows for improving light-extracting efficiency of the light-emitting device. The bonding member 30 has higher transmittance with respect to light emitted from the light-emitting element 10 than the first covering member 40. It is preferable that the lower end of the inclined surface 31 is located at a distance in a range of 0.2 times as large as the thickness of the light-emitting element 10 or less from the plane of the first element surface 11. This configuration allows for increasing an area of the bonding member 30 that covers the lateral surfaces of the light-emitting element, so that light-extracting efficiency of the light-emitting device can be improved.

First Covering Member 40

The first covering member 40 covers the bonding member 30 and the wavelength conversion plate 20. For the resin material of the first covering member 40, thermosetting light-transmissive resins such as a dimethyl silicone resin, a phenyl silicone resin, a modified silicone resin, an epoxy resin, and a phenol resin can be preferably used. The first covering member 40 also has light reflectivity. In order to effectively reflect light emitted from the light-emitting element 10, a light-reflective resin with increased reflectance is preferably used. For example, a light-transmissive resin in which a light-reflective substance is dispersed may be used. For the light-reflective substance, titanium oxide, silicon oxide, zirconium oxide, potassium titanate, aluminum oxide, aluminum nitride, boron nitride, mullite, or the like is preferable. The light-reflective substance may be used in the form of, for example, particles, fiber, and flakes. In particular, a light-reflective substance in the form of fiber is preferable because the fibrous light-reflective substance is also expected to have an effect of decreasing a coefficient of thermal expansion of the first covering member 40. The reflectance of the first covering member 40 with respect to light emitted from the light-emitting element 10 is 70% or more. Thus, light reaching the first covering member 40 is reflected toward the second conversion-plate surface 22 of the wavelength conversion plate 20, so that light-extracting efficiency of the light-emitting device can be improved.

It is preferable that the first covering member 40 is in contact with lateral surfaces of the wavelength conversion plate 20 so as to cover the lateral surfaces of the wavelength conversion plate 20. This allows for obtaining a light-emitting device with good "visibility", which refers to good contrast between a light-emitting region and a non-light-emitting region. A portion of the first covering member 40 is preferably located between the first element surface 11 and the support member 1. This allows for reflecting light emitted from the light-emitting element by the portion of the first covering member 40 between the first element surface 11 and the support member 1, so that absorption of light by the support member can be reduced. It is preferable that the first covering member 40 is inclined from an outer edge of the wavelength conversion plate 20 toward an outer edge of the light-emitting device such that a thickness of the first covering member 40 is reduced at the outer periphery of the light-emitting device. With this configuration, in the case in which the light-emitting device includes the sealing member 50 covering the wavelength conversion plate 20 and the first covering member 40, the lower surface of the sealing member 50 can be located at a lower position at the outer periphery of the light-emitting device, so that a thickness of the light-emitting device can be reduced.

Sealing Member 50

Figure 3:
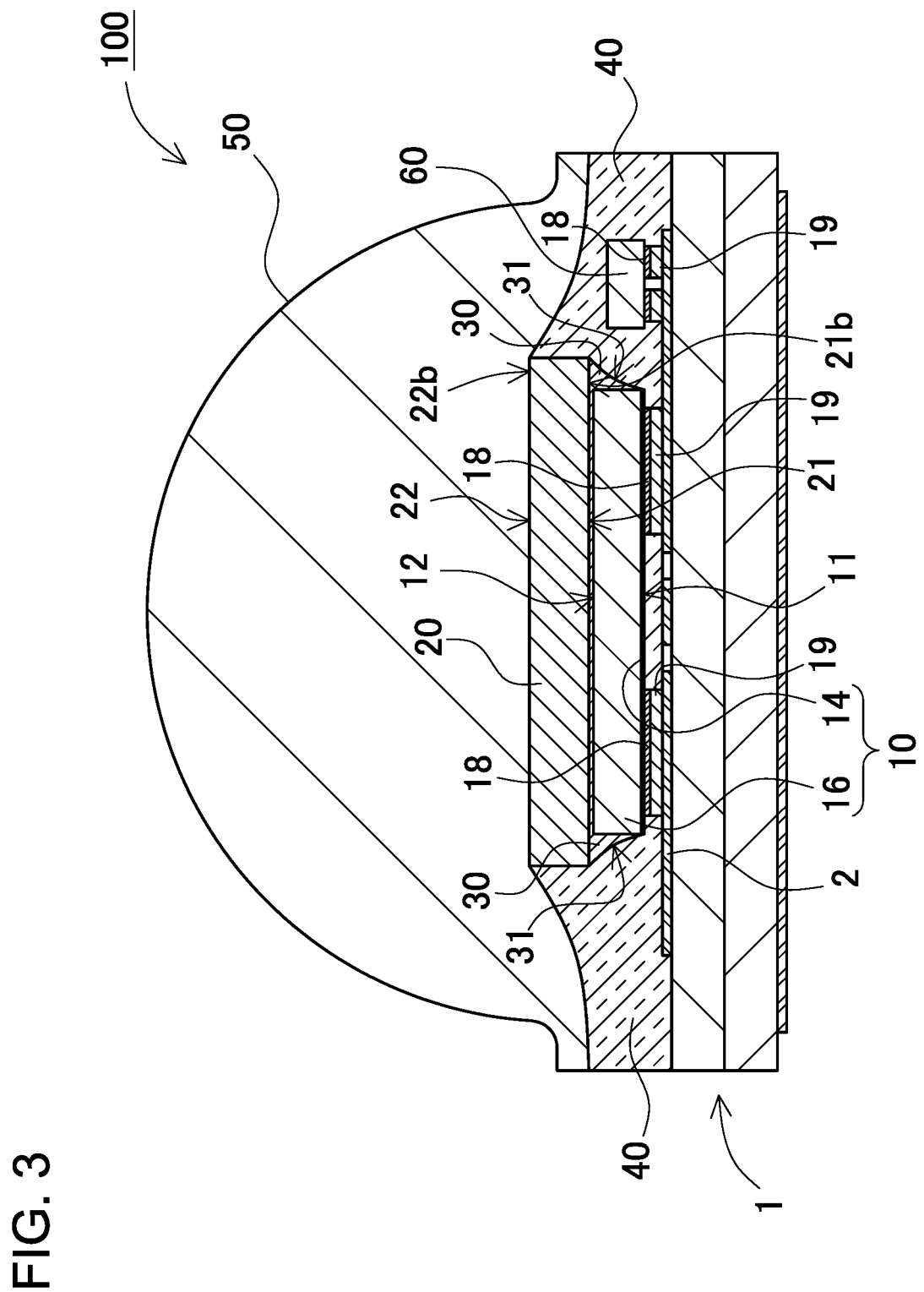
FIG. 3 is a schematic cross-sectional view of the light-emitting device in FIG. 1, taken along the line III-III.

As illustrated in FIG. 1, FIG. 3, etc., the sealing member 50 is disposed on the upper surface of the wavelength conversion plate 20. The sealing member 50 includes a lens portion having a circular shape in a plan view and a hemispherical shape in cross-sectional view, and a flange portion extended outwardly from the lens portion. For the sealing member 50, a light-transmissive sealing member having light-transmissivity may be used. For example, a light-transmissive resin or glass may be used for the light-transmissive sealing member. In particular, light-transmissive resin is preferable. Examples of the light-transmissive resin include thermosetting resins such as a silicone resin, a modified silicone resin, an epoxy resin, and a phenol resin, and thermoplastic resins such as a polycarbonate resin, an acryl resin, methylpentene resin, and polynorbornene resin. In particular, a silicone resin with good light resistance and heat resistance is preferable. The sealing member 50 may further contain various fillers or the like for the purpose of, for example, adjusting viscosity.

Protection Device 60

The light-emitting device 100 can further include a protection device 60 to protect the light-emitting element 10 from breakdown caused by overcurrent. In the schematic cross-sectional view in FIG. 3, the protection device 60 is embedded in the first covering member 40. For the protection device 60, for example, a Zener diode or a capacitor can be used. A protection device with electrodes at one surface thereof is preferable because such a protection device can be mounted in a face-down manner without wires.

Light Emission Pattern 70

Moreover, varying a shape of the inclined surface 31 of the bonding member 30 in accordance with a cross-sectional position allows a light emission pattern 70 of the light-emitting element 10 in a plan view to be close to a circular shape. More specifically, intense light is emitted at the second element surface 12, which is the light-emitting surface of the light-emitting element 10, and thus intense light is also emitted in a region on the second conversion-plate surface 22 that overlaps the second element surface 12. Further, with the second element surface having a polygonal shape, the light emission pattern does not have a circular shape but has a polygonal shape. In other words, the shape of the light-emitting element appears as the light emission pattern. This is undesirable in view of quality of illumination light, which preferably has a circular projection pattern.

Figure 5:
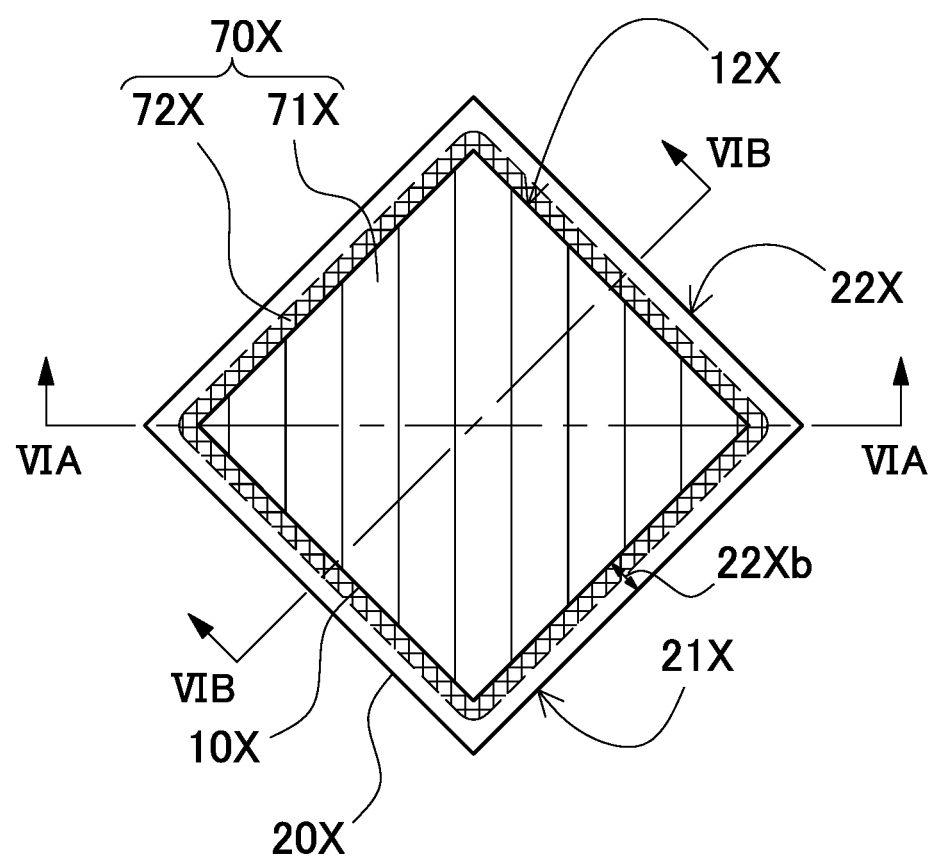
FIG. 5 is a schematic perspective plan view of a light-emitting element and a wavelength conversion plate of a light-emitting device according to a comparative example.
Figure 6A:
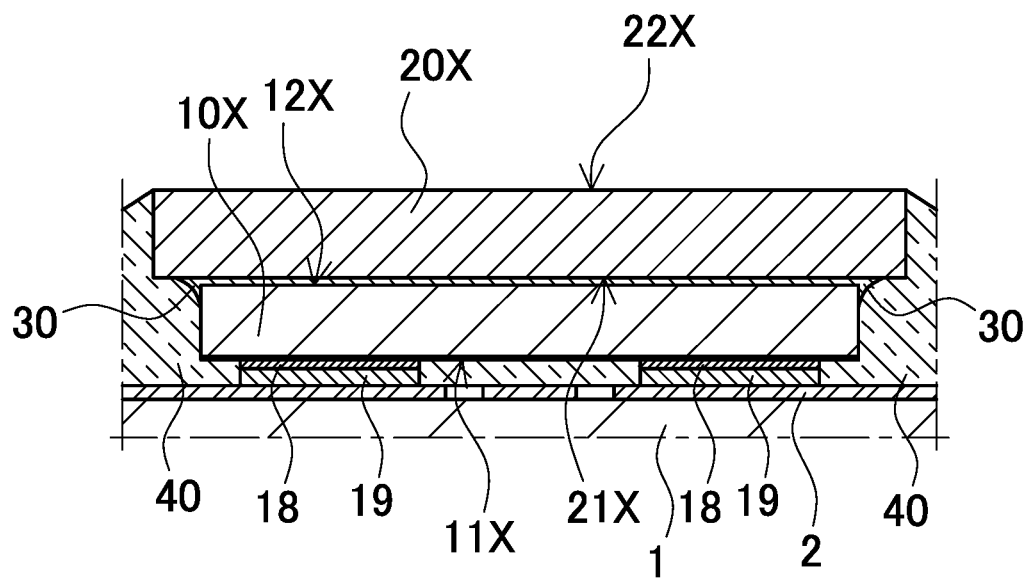
FIG. 6A is a schematic cross-sectional view of the light-emitting device in FIG. 5, taken along the line VIA-VIA.
Figure 6B:
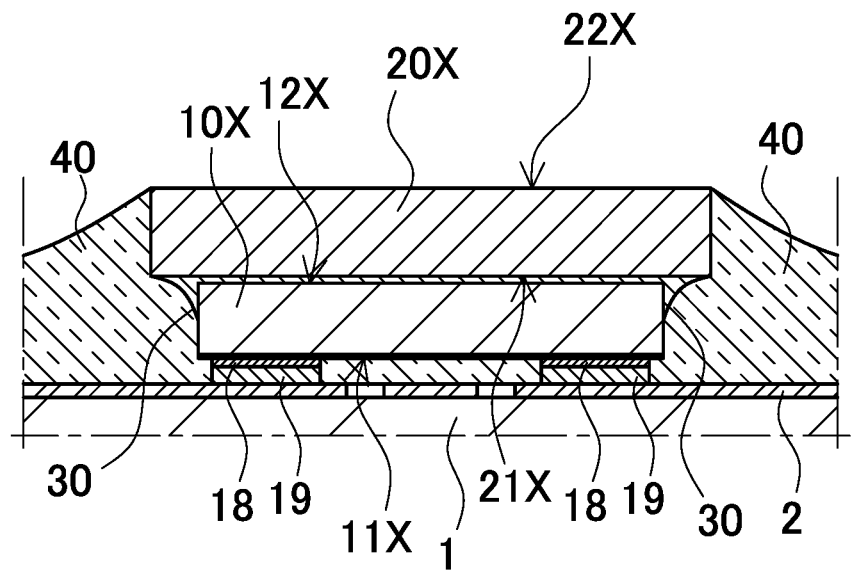
FIG. 6B is a schematic cross-sectional view of the light-emitting device in FIG. 5, taken along the line VIB-VIB.

As a comparative example, FIG. 5 shows a schematic plan view of a light-emitting element 10X having a quadrangular planar shape, FIG. 6A shows a schematic cross-sectional view taken along the line VIA-VIA in FIG. 5; and FIG. 6B shows a schematic cross-sectional view taken along the line VIB-VIB in FIG. 5, which is inclined by 45 degrees from the line VIA-VIA. A light emission pattern 70X of the light-emitting element 10X is rectangular as indicated by a dashed line in FIG. 5. That is, intense white light is obtained at a first region 71X where a second element surface 12X of the light-emitting element 10X overlaps a first conversion-plate surface 21X of a wavelength conversion plate 20X, as indicated by hatching with slant lines in FIG. 5. Meanwhile, at a peripheral region 22Xb of the second conversion-plate surface 22X where the second conversion-plate surface 22X does not overlap a first element surface 11X, light that has leaked from lateral surfaces of the light-emitting element 10X, is partially extracted to form a second region 72X. With this configuration, as illustrated in FIGS. 6A and 6B, the first covering member 40 has a substantially constant cross-sectional shape irrespective of the cross-sectional position, so that the second region 72X, which is obtained by the leaked light, is disposed along the periphery of the light-emitting element 10X, as indicated by cross-hatching in FIG. 5. Thus, the whole light emission pattern 70X has a shape that substantially corresponds to the planar shape of the light-emitting element 10X.

Figure 7:
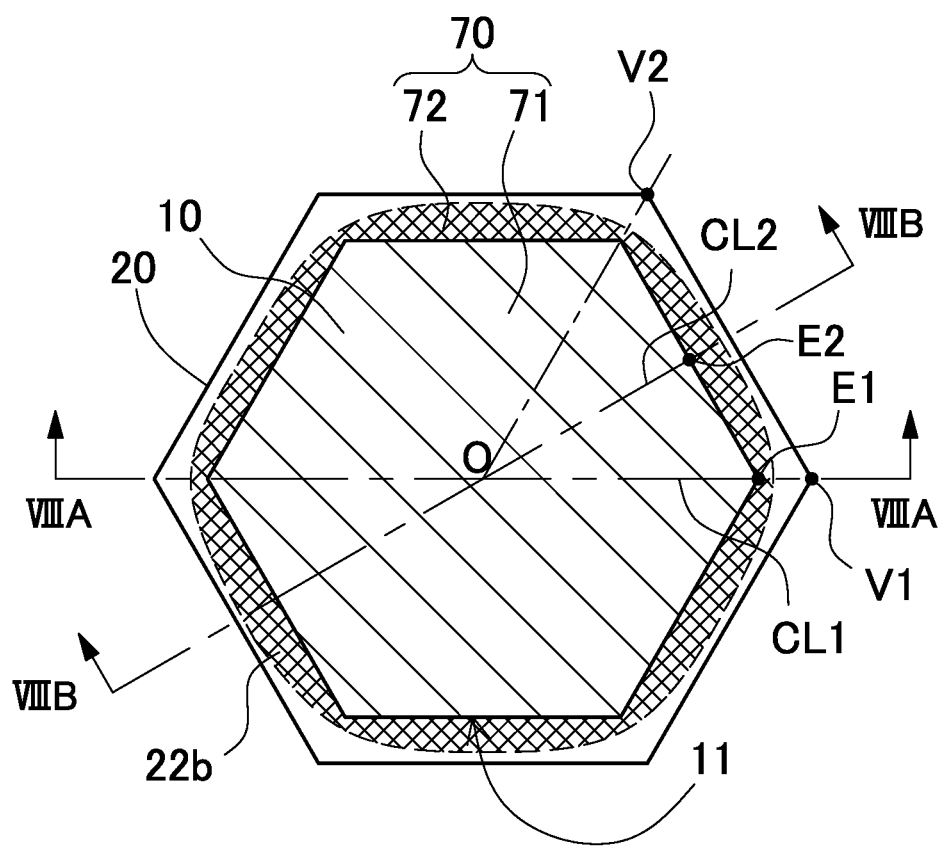
FIG. 7 is a schematic perspective plan view of a light-emitting element and a wavelength conversion plate of the light-emitting device in FIG. 1.

In contrast, in the present embodiment, the planar shape of the light-emitting element 10 is a polygon with five or more angles, and further, the inclined surface 31 of the first covering member 40 is adjusted to allow the light emission pattern 70 of the light-emitting element 10 to have a shape close to a circular shape in a plan view. More specifically, a cross-sectional shape of the inclined surface 31 of the bonding member 30 is varied in accordance with cross-sectional positions so that the light emission pattern 70 of the light-emitting element 10 in a plan view is close to a circular shape, as indicated by a dashed line in a schematic cutaway plan view in FIG. 7. In FIG. 7 as well, intense light is emitted at a first region 71 (i.e., region indicated by hatching with slant lines in FIG. 7) where the second conversion-plate surface 22 overlaps the second element surface 12. Meanwhile, at a peripheral region 22b of the second conversion-plate surface 22 where the second conversion-plate surface 22 does not overlap the second element surface 12, light leaked from the lateral surfaces of the light-emitting element 10 is partially extracted upward, so that an amount of light at the peripheral region 22b is relatively smaller than an amount of light at a center region of the second conversion-plate surface 22. In view of this, at the peripheral region 22b of the second conversion-plate surface 22, adjustment of extraction amounts of light emitted from the lateral surfaces of the light-emitting element 10 and reflected light allows the light emission pattern 70 to have a shape close to a circular shape. More specifically, reduction in an amount of light in the vicinity of each corner of the second conversion-plate surface 22 and increase in amount of light at a middle portion between adjacent corners the second conversion-plate surface 22 allows the light emission pattern 70 to have a shape close to a circular shape rather than the polygonal shape. This will be described in detail below.

First Cross-Section

In the schematic perspective plan view in FIG. 7 in which the light-emitting element 10 and the wavelength conversion plate 20 are illustrated, a line passing the center O of the hexagonal light-emitting element 10 and a first vertex V1 (on the right end in FIG. 7), which is one of the vertices of the polygonal shape of the wavelength conversion plate 20, is referred to as a first cross-sectional line CL1. A cross-sectional shape along the first cross-sectional line CL1 is referred to as a first cross-section, and is shown in a schematic cross-sectional view in FIG. 8A. As described above, the bonding member 30 has the inclined surface 31 formed between the first conversion-plate surface 21 and the first element surface 11. As used herein, an inclined surface of the bonding member 30 at the first cross-section is referred to as an inclined surface 31A. In this cross-sectional view, the bonding member 30 may have tip portions (i.e., lower ends in FIG. 8A) located at the first element surface 11 or located at a portion between the first element surface 11 and the second element surface 12.

Second Cross-Section

Meanwhile, a line passing the midpoint between a side that connects the first vertex V1 to a second vertex V2 (on the upper right side in FIG. 7), which is a vertex of the polygonal shape of the wavelength conversion plate 20 adjacent to the first vertex V1, and the center O of the light-emitting element 10 is referred to as a second cross-sectional line CL2. A cross-sectional shape along the second cross-sectional line CL2 is referred to as a second cross-section, and shown in a schematic cross-sectional view in FIG. 8B. As used herein, an inclined surface of the bonding member 30 at the second cross-section is referred to as an inclined surface 31B.

First Bonding Points E1 and Second Bonding Points E2

Figure 8A:
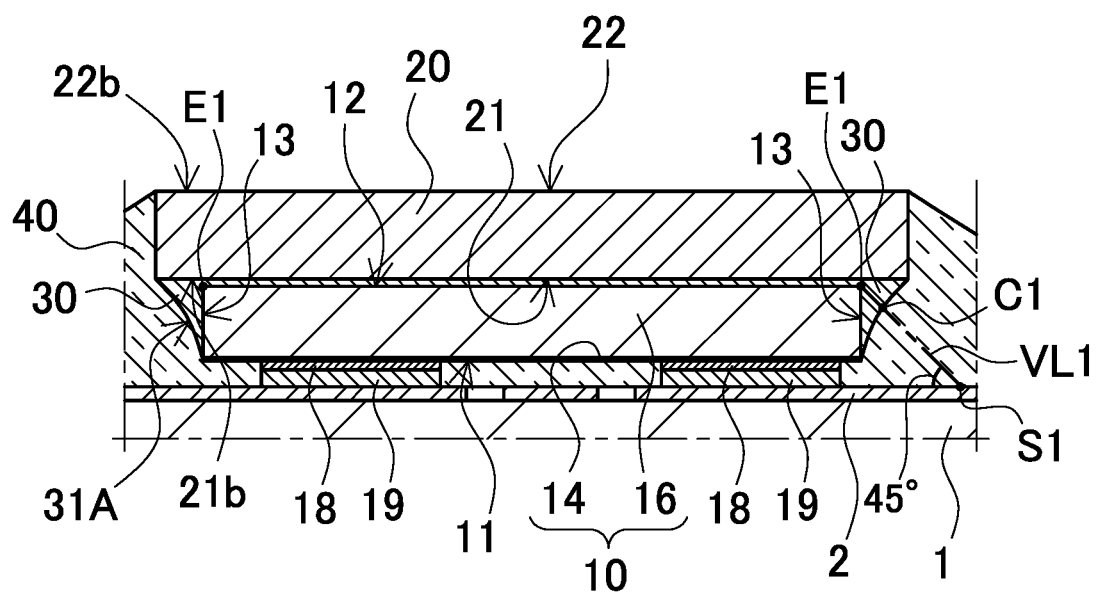
FIG. 8A is a schematic cross-sectional view of the light-emitting device in FIG. 7, taken along the line VIIIA-VIIIA.
Figure 8B:
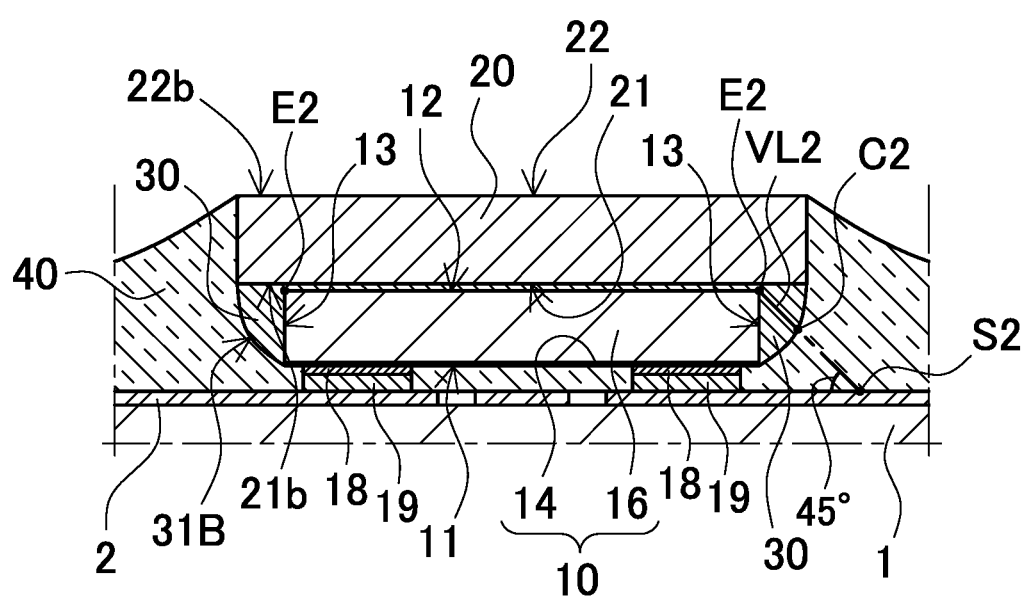
FIG. 8B is a schematic cross-sectional view of the light-emitting device in FIG. 7, taken along the line VIIIB-VIIIB.

When comparing the first cross-section and the second cross-section, the inclined surface 31A of the bonding member 30 in the first cross-section is located closer to the lateral surface of the light-emitting element 10 than the inclined surface 31B at the second cross-section. As illustrated in FIGS. 8A and 8B, in a cross-sectional view, portions of the lateral surfaces 13 of the light-emitting element 10 that are located closest to the first conversion-plate surface 21 in FIGS. 8A and 8B are referred to as first bonding points E1 and second bonding points E2, respectively, between the light-emitting element 10 and the wavelength conversion plate 20. Imaginary line segments extended between the first bonding points E1 and a surface S1 of the support member 1 at an inclination angle of 45 degrees with respect to the surface S1 and imaginary line segments extended between the second bonding points E2 and a surface S2 of the support member 1 at an inclination angle of 45 degrees with respect to the surface S2—that is, imaginary line segments connecting E1 to S1 and E2 to S2—are referred to as a first line segment VL1 and a second line segment VL2, respectively. The first line segment VL1, which is the imaginary line segment in the first cross-section, and the inclined surface 31A of the bonding member intersect at a first intersection point C1. The second line segment VL2, which is the imaginary line segment at the second cross-section, and the inclined surface 31B intersect at a second intersection point C2. A distance between the first joint points E1 and the first intersection point C1 is shorter than a distance between the second joint points E2 and the second intersection point C2. With such variation in shape of the inclined surface 31 of the bonding member 30 in accordance with positions of cross-sections of the polygonal light-emitting element 10, the shape of the first covering member 40 that covers the inclined surface 31 can be varied accordingly. Thus, an amount of reflected light of the light-emitting element 10 is adjusted to allow the light emission pattern 70 to have a shape close to a circular shape. More specifically, in the first cross-section through a corner of the light-emitting element 10, the inclined surface 31A is located closer to a corresponding one of the lateral surfaces of the light-emitting element 10, so that light reflected by the first covering member 40 can easily return to the light-emitting element 10 through the bonding member. Meanwhile, in the second cross-section on the midpoint between the adjacent two corners, the inclined surface 31B is apart from the lateral surface of the light-emitting element 10, so that light reflected by the first covering member 40 can be easily emitted upward from the light-emitting device, that is, toward the wavelength conversion plate 20 through the bonding member. With this configuration, an amount of light emitted upward from the light-emitting device through the bonding member at a portion in the second cross-section is larger than an amount of light emitted upward from the light-emitting device through the bonding member at a portion in the first cross-section. Accordingly, brightness in the vicinity of a corner of the hexagonal second conversion-plate surface 22 is relatively smaller whereas brightness between adjacent corners of the hexagonal second conversion-plate surface 22 is relatively greater. Thus, as indicated by the dashed line in FIG. 7, the light emission pattern 70 can have a shape closer to a circular shape rather than the hexagonal shape, so that the quality of illumination light can be increased. More specifically, with the light-emitting element 10 having a polygonal shape in a plan view, the first region 71 (i.e., region hatched with the slant lines in FIG. 7) of the light emission pattern 70 where the second conversion-plate surface 22 overlaps the second element surface 12 can have a shape closer to a circle rather than a quadrangular shape. Also, in a second region 72 around the first region 71, an amount of light in the vicinity of the corners of light-emitting element 10 can be reduced, whereas an amount of light in the vicinity of middle portions of the sides of the light-emitting element 10 can be increased. This allows the light emission pattern 70, which includes the first region 71 and the second region 72, to have a shape closer to a circular shape. Moreover, optical coupling with the sealing member 50, which is disposed on the upper surface of the wavelength conversion plate 20 and has a circular shape in a plan view, can be improved, so that the quality of light emitted from the sealing member 50 can be improved.

It is preferable that the inclined surface 31B of the bonding member 30 at the second cross-section is convexly curved as shown in the schematic cross-sectional view in FIG. 8B so that light emitted from the lateral surfaces of the light-emitting element 10 and reflected by the first covering member 40 at a middle portion of each of the sides that form the polygonal shape of the second conversion-plate surface 22, that is, at the second cross-section, can be emitted upward from the light-emitting device. A portion of the first covering member 40 in contact with the inclined surface 31B having the convexly curved surface has a concave shape.

On the other hand, the inclined surface 31A of the bonding member 30 at the first cross-section passing each of the corners of the polygonal second conversion-plate surface 22 is concavely curved so that light reflected by the first covering member 40 is not easily emitted upward from the light-emitting device. A portion of the first covering member 40 in contact with the inclined surface 31A having the concavely curved surface has a convex shape.

It is preferable that the shape pf the inclined surface 31 of the bonding member 30 is continuously varied between the first cross-section and the second cross-section. Thus, the amount of light emitted from the light-emitting element 10 and reflected by the first covering member 40 can be varied to allow the light emission pattern 70 to have a shape close to a circular shape more effectively.

The second cross-sectional line CL2 preferably passes the midpoint between two adjacent corners of the corners of the light-emitting element 10 in a plan view. This allows the second cross-sectional line CL2 to pass a point of contact of a circle inscribed in the polygonal shape such as a hexagon, which allows the light emission pattern 70 to have a shape closer to a perfect circle. It should be noted that, the second cross-sectional line CL2 may not necessarily be a line that passes the midpoint between adjacent two of the vertexes of the polygonal shape in a strict sense. Even if the second cross-sectional line CL2 passes the vicinity of the midpoint between adjacent two of the vertexes of the polygonal shape, the light emission pattern 70 can have a shape closer to a perfect circle. For example, the first cross-sectional line CL1 and the second cross-sectional line CL2 may define substantially 45 degrees. In the present specification, "substantially 45 degrees" allows deviation of approximately plus-minus 3 degrees from 45 degrees.

As illustrated in the schematic plan view in FIG. 5, in the case of the quadrangular light-emitting element 10X according to the comparative example, a distance between the center of the light-emitting element 10X and one vertex of the quadrangular shape (see the schematic cross-sectional view in FIG. 6A, taken along the line VIA-VIA) is longer than a distance between the center of the light-emitting element 10X and one side of the quadrangular shape (see the schematic cross-sectional view in FIG. 6B, taken along the line VIB-VIB inclined by 45 degrees). Due to such a configurational difference, a portion of the bonding member at a cross-section along a line segment between the center of the light-emitting element 10X having a quadrangular shape in a plan view and one corner of the light-emitting element of the quadrangular shape in a plan view tends to be smaller than a portion of the bonding member at a cross-section along a line segment between the center of the quadrangular light-emitting element 10X in a plan view and the midpoint of one side that connects one corner of the light-emitting element having the quadrangular shape in a plan view to its adjacent corner. That is, a portion of the bonding member 30 in the vicinity of each corner, which is located at a longer distance from the center of the light-emitting element 10X, has a relatively small size. In contrast, a portion of the bonding member 30 in the vicinity of the midpoint of each of edges, which is located at a shorter distance from the center of the light-emitting element 10X, has a relatively large size. Accordingly, when the bonding member 30 reaches the first element surface 11 in the vicinity of the midpoint of each edge, where a size of the bonding member 30 tends to be increased, it is difficult for the bonding member 30 to reach the first element surface 11 in the vicinity of each corner. Meanwhile, when the bonding member 30 reaches the first element surface 11 in the vicinity of each corner of the light-emitting element 10X, the size of the bonding member 30 in the vicinity of the midpoint of each side is easily increased. Thus, the bonding member 30 may be in contact with the support member 1, which may lead to absorption of light emitted from the light-emitting element 10 by the support member 1, thus degrading light-extracting efficiency. In this manner, due to unevenness in a size of the bonding member 30, it was difficult to form the bonding member 30 so that an end portion of the bonding member 30 is located at the element first surface 11 both in the vicinity of each corner and in the vicinity of the midpoint of each edge.

In contrast, in the present embodiment, with the light-emitting element 10 having a polygonal shape with five or more sides in a plan view, a difference between a distance between the center of the light-emitting element 10 and one corner of the light-emitting element 10 and a distance between the center of the light-emitting element 10 and the midpoint of one edge of the light-emitting element 10 is smaller than that in the case of the quadrangular shape. Accordingly, difference in size of the bonding member 30 is reduced, and the size of the bonding member 30 can be controlled easily so that the bonding member reach the vicinity of the first element surface 11. This allows for obtaining an advantage of preventing reduction in light-extracting efficiency due to absorption of light from the light-emitting element by the support member.

Second Embodiment

Figure 11:
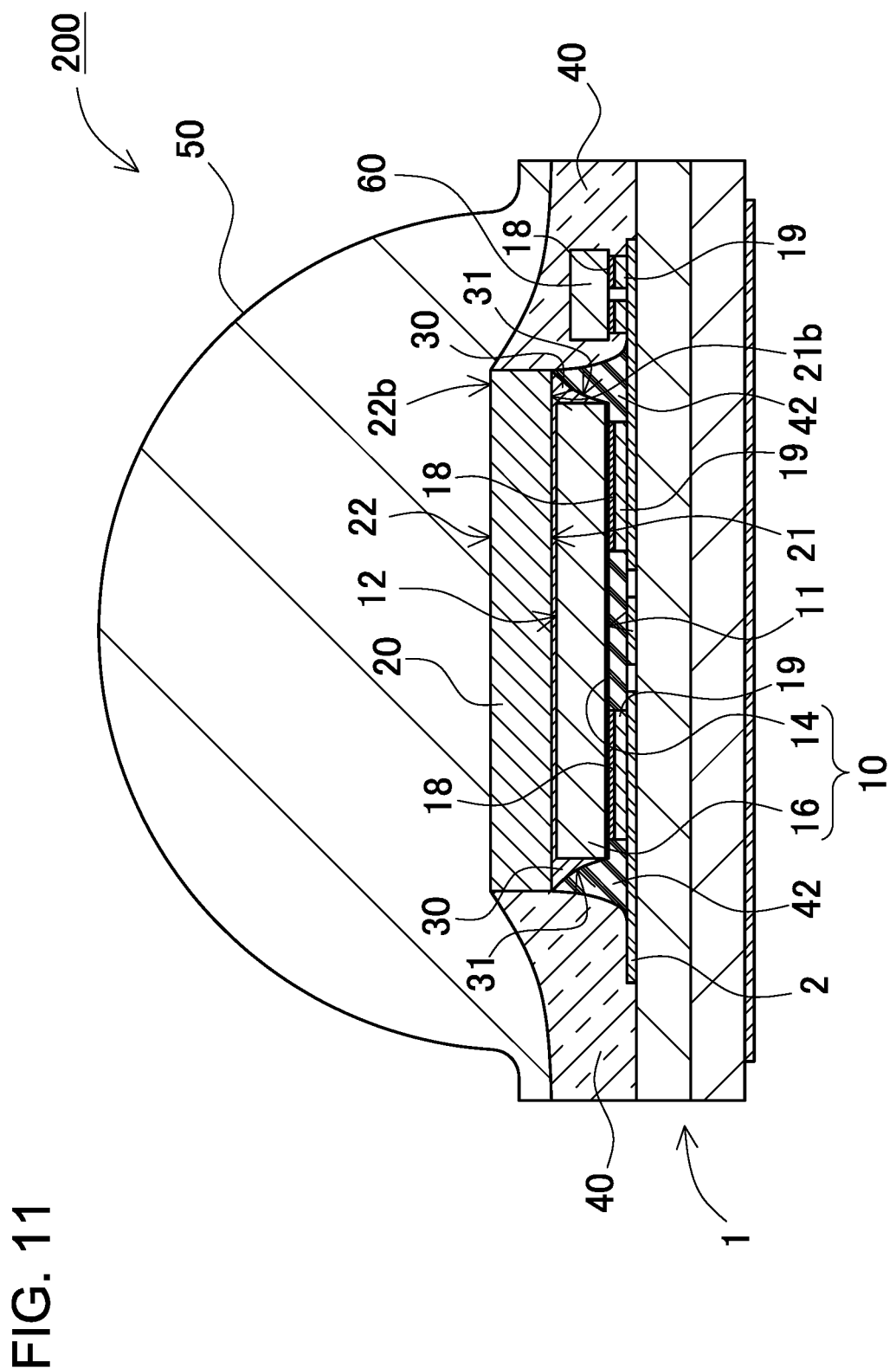
FIG. 11 is a schematic vertical cross-sectional view of a light-emitting device according to a second embodiment.

A second covering member may be further provided to cover the inclined surface 31 of the bonding member 30. Such an example is illustrated as a light-emitting device 200 according to a second embodiment in a schematic cross-sectional view in FIG. 11. In the light-emitting device 200 illustrated in FIG. 11, components that is the same as in the first embodiment described above are denoted with same reference numerals, and detailed description thereof will be omitted. The light-emitting device 200 in FIG. 11 has the inclined surface 31 of the bonding member 30 covered with a second covering member 42. The second covering member 42 is disposed between the inclined surface 31 and the surface of the support member 1. The second covering member 42 broadens toward a surface of the support member 1 so as to have a width increased from the inclined surface 31 toward a surface of the support member 1. Also, the second covering member 42 is disposed between the first element surface 11 of the light-emitting element 10 and the surface of the support member 1, and functions to fill this area. A reflective member such as titanium oxide may be further mixed into the second covering member 42. A surface of the second covering member 42 is covered with the first covering member 40.

For the second covering member 42, a material having a lower coefficient of linear expansion than a material of the first covering member 40 is used. For example, a dimethyl silicone resin may be used for the second covering member 42. With the second covering member 42 having a lower coefficient of linear expansion disposed between the lower surface of the light-emitting element 10 and the support member 1, it is possible to prevent occurrence of detachment of the light-emitting element 10 due to expansion of the resin that constitutes the first covering member 40.

Method of Manufacturing Light-Emitting Device

Figure 9A:
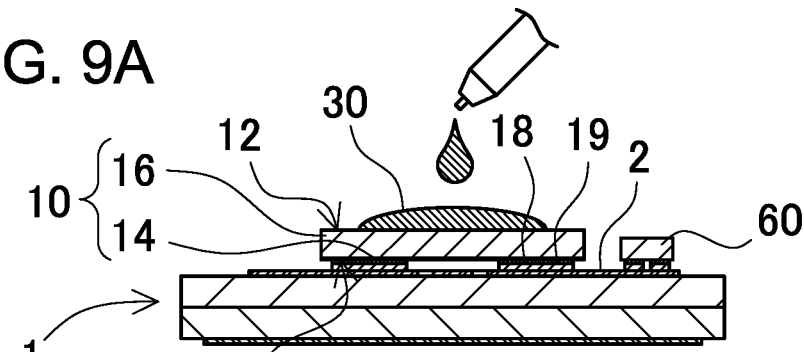
FIGS. 9A to 9D are schematic cross-sectional views illustrating steps of manufacturing the light-emitting device.

A method of manufacturing the light-emitting device will be described below with reference to FIGS. 9A to 9D. As illustrated in FIG. 9A, the conductive members 2 are formed on the surface of the support member 1. Then, the light-emitting element 10 is mounted on the support member 1. In order to connect the electrodes 18 of the light-emitting element 10 to the conductive members 2, the first element surface 11 of the light-emitting element 10 to is fixed to the support member 1 using the connecting members 19 such as solder, ultrasonic oscillation, or the like. Further, a predetermined amount of the bonding member 30 in an uncured state is applied to the second element surface 12 of the light-emitting element 10.

Figure 9B:
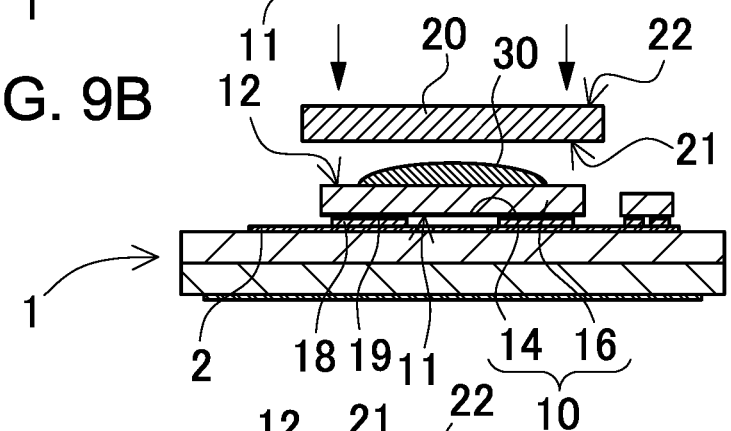
Figure 9C:
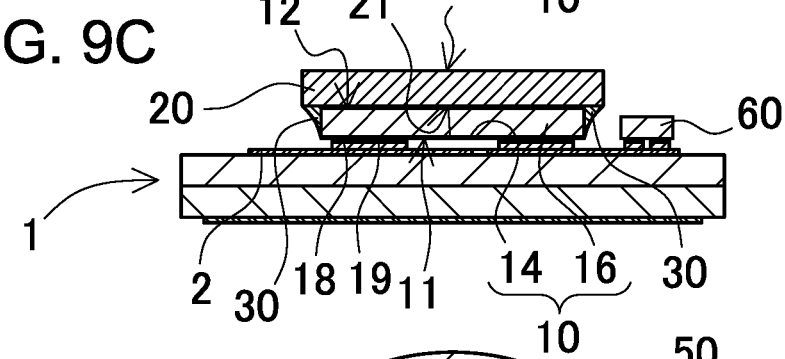

In this state, as illustrated in FIG. 9B, the wavelength conversion plate 20 is disposed at the upper surface of the light-emitting element 10. Thus, when the uncured bonding member 30 between the second element surface 12 and the first conversion-plate surface 21 is spread and pressed toward the peripheral region 21b of the first conversion-plate surface 21, as illustrated in FIG. 9C, the uncured bonding member 30 flows down along the lateral surfaces of the light-emitting element 10. Accordingly, the inclined surface 31, which is tapered from the first conversion-plate surface 21 toward the second element surface 12, is formed. Viscosity or the like of the bonding member 30 are adjusted in advance so that the inclined surface 31 have shapes different at the first cross-section and the second cross-section. In this state, the bonding member 30 is cured.

Figure 9D:
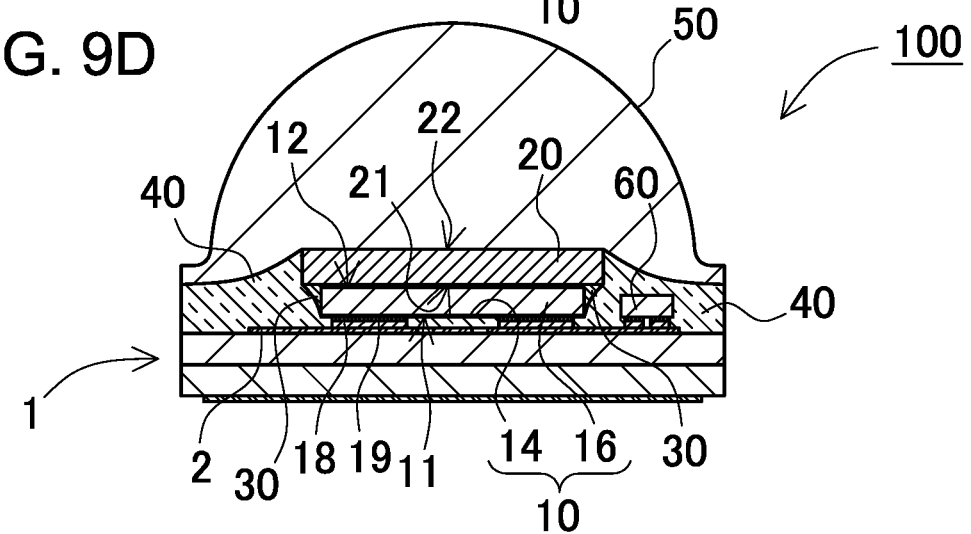
Figure 10:
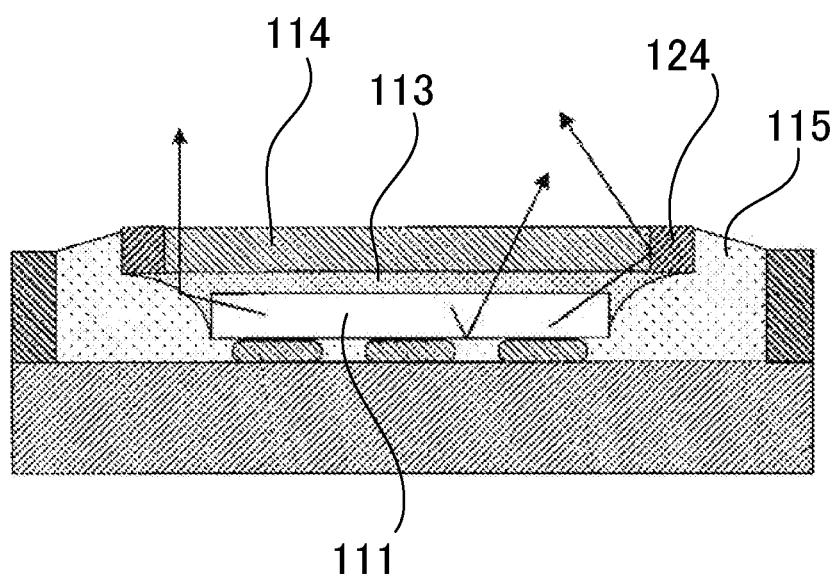
FIG. 10 is a schematic vertical cross-sectional view of a background art light-emitting device.

As illustrated in FIG. 9D, the lateral surfaces of the wavelength conversion plate 20 and the lateral surfaces of the bonding member 30 are covered with the first covering member 40, and the sealing member 50 is further fixed on the upper surfaces of the wavelength conversion plate 20 and the first covering member 40. Thus, the light-emitting device 100 illustrated in FIG. 3 can be obtained.

In a manner as described above, with the light-emitting element 10 having a polygonal shape with five or more sides, the inclined surface 31 of the bonding member 30 at the peripheral region 21b of the first conversion-plate surface 21 can be adjusted to vary the profile of the first covering member 40, which is in contact with the inclined surface 31, in accordance with positions of cross-sections. Thus, brightness in the vicinity of each corner of the light-emitting element 10 in a plan view is reduced, and brightness in the vicinity of a middle portion between adjacent ones of corners of the light-emitting element 10 in a plan view is increased, so that the light emission pattern 70 in a plan view can have a shape close to a circular shape rather than a polygonal shape. This allows for reducing unevenness in light distribution depending on an angle of the light-emitting device.

The light-emitting devices according to certain embodiments of the present invention is suitably applicable to backlight sources for devices such as LED display devices and liquid crystal display devices, illumination light sources, headlights, traffic lights, illuminated switches, various sensors, various indicators, and other light sources for general use.

It should be apparent to those with an ordinary skill in the art that, while various embodiments of the invention have been shown and described, it is contemplated that the invention is not limited to the particular embodiments disclosed. Rather, the disclosed embodiments merely illustrative of the inventive concepts and should not be interpreted as limiting the scope of the invention. Suitable modifications and changes may fall within the scope of the invention as defined in the appended claims.

What is claimed is:

1. A light-emitting device comprising:
    a support member;
    a light-emitting element mounted on the support member, the light-emitting element having a polygonal shape with five or more sides in a plan view and comprising:
        a first element surface, and
        a second element surface opposite to the first element surface and being a light-emitting surface;
    a wavelength conversion plate comprising:
        a first conversion-plate surface, and
        a second conversion-plate surface opposite to the first conversion-plate surface and having a smaller area than that of the first element surface;
    a bonding member bonding the first conversion-plate surface and the second element surface together; and
    a first covering member that is light-reflective and covers the bonding member and the wavelength conversion plate,
    wherein the bonding member is disposed continuously from a bonding region formed between the first conversion-plate surface and the second element surface toward lateral surfaces of the light-emitting element, and comprises an inclined surface that is inclined from a peripheral region of the first conversion-plate surface toward the first element surface at lateral surfaces of the light-emitting element, and
    wherein, where a first cross-sectional line connects a center of the light-emitting element to a first vertex of the polygonal shape, and a second cross-sectional line connects a midpoint of a side connecting the first vertex and a second vertex that is adjacent to the first vertex to the center of the light-emitting element, a portion of the inclined surface of the bonding member at a first cross section along the first cross-sectional line is located closer to a lateral surface of the light-emitting element than a portion of the inclined surface of the bonding member at a second cross section along the second cross-sectional line.

2. The light-emitting device according to claim 1, wherein the inclined surface of the bonding member is concavely curved at the first cross section along the first cross-sectional line, and is convexly curved at the second cross section along the second cross-sectional line.

3. The light-emitting device according to claim 1, further comprising:
    a sealing member disposed on an upper surface of the wavelength conversion plate and having a hemispherical shape.

4. The light-emitting device according to claim 1, wherein the wavelength conversion plate comprises a plate made of a resin containing a fluorescent material.

5. The light-emitting device according to claim 1, wherein the wavelength conversion plate comprises a plate that is made of glass containing a fluorescent material, and that has a substantially uniform thickness.

6. The light-emitting device according to claim 1, wherein the light-emitting element has a hexagonal shape in a plan view.

7. The light-emitting device according to claim 1, wherein lateral surfaces of the wavelength conversion plate are in contact with the first covering member.

8. The light-emitting device according to claim 1, wherein the first covering member is disposed between the first element surface and the support member.

9. The light-emitting device according to claim 1, further comprising:
   a second covering member covering the inclined surface of the bonding member.

10. The light-emitting device according to claim 9, wherein the second covering member is disposed between the first element surface and the support member.

11. The light-emitting device according to claim 1, wherein the bonding member is apart from the support member.

* * * * *